(12) United States Patent
Suda et al.

(10) Patent No.: US 12,341,020 B2
(45) Date of Patent: Jun. 24, 2025

(54) SUBSTRATE PROCESSING METHOD AND SUBSTRATE PROCESSING APPARATUS

(71) Applicant: Tokyo Electron Limited, Tokyo (JP)

(72) Inventors: Ryutaro Suda, Miyagi (JP); Maju Tomura, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 462 days.

(21) Appl. No.: 17/738,003

(22) Filed: May 6, 2022

(65) Prior Publication Data
US 2022/0367202 A1    Nov. 17, 2022

(30) Foreign Application Priority Data

May 7, 2021    (JP) ................................. 2021-078904

(51) Int. Cl.
| | |
|---|---|
| *H01L 21/311* | (2006.01) |
| *H01J 37/32* | (2006.01) |
| *H01L 21/02* | (2006.01) |
| *H01L 21/3213* | (2006.01) |

(52) U.S. Cl.
CPC .. *H01L 21/31116* (2013.01); *H01J 37/32449* (2013.01); *H01J 37/32816* (2013.01); *H01J 37/32972* (2013.01); *H01J 2237/3341* (2013.01); *H01L 21/02164* (2013.01); *H01L 21/0217* (2013.01); *H01L 21/31144* (2013.01); *H01L 21/32137* (2013.01); *H01L 21/32139* (2013.01)

(58) Field of Classification Search
None
See application file for complete search history.

(56) References Cited

U.S. PATENT DOCUMENTS

| | | | |
|---|---|---|---|
| 2002/0084256 A1* | 7/2002 | Donohoe | H01L 21/31116 257/E21.252 |
| 2003/0114012 A1* | 6/2003 | Lee | H01L 21/76897 257/E21.507 |
| 2012/0267340 A1* | 10/2012 | Kakimoto | H01L 21/31116 216/37 |
| 2021/0343539 A1* | 11/2021 | Suda | H01J 37/32449 |
| 2022/0051902 A1* | 2/2022 | Tanaka | H01J 37/32724 |

FOREIGN PATENT DOCUMENTS

| | | |
|---|---|---|
| JP | H03-185724 A | 8/1991 |
| JP | H09-321025 A | 12/1997 |
| JP | 2016-039310 A | 3/2016 |
| JP | 2016-188882 A | 11/2016 |

* cited by examiner

*Primary Examiner* — Allan W. Olsen
(74) *Attorney, Agent, or Firm* — XSENSUS LLP

(57) ABSTRACT

A substrate processing method includes: providing a substrate including a silicon-containing film in a chamber; supplying a processing gas including HF gas into the chamber; etching the silicon-containing film with plasma generated from the processing gas, thereby forming a recess in the silicon-containing film; and controlling a partial pressure of the HF gas to decrease the partial pressure of the HF gas with an increase of an aspect ratio of the recess.

22 Claims, 9 Drawing Sheets

SUBSTRATE PROCESSING METHOD AND SUBSTRATE PROCESSING APPARATUS

CROSS-REFERENCE TO RELATED APPLICATION

This application is based on and claims priority from Japanese Patent Application No. 2021-078904, filed on May 7, 2021, with the Japan Patent Office, the disclosure of which is incorporated herein in its entirety by reference.

TECHNICAL FIELD

The present disclosure relates to a substrate processing method and a substrate processing apparatus.

BACKGROUND

Japanese Laid-Open Patent Publication No. 2016-039310 discloses a technique which etches a silicon-containing film using plasma.

SUMMARY

According to an aspect of the present disclosure, a substrate processing method includes steps (a1), (a2), (a3), and (a4). In (a1), a substrate including a silicon-containing film is provided in a chamber. In (a2), a processing gas including HF gas is supplied into the chamber. In (a3), the silicon-containing film is etched with plasma generated from the processing gas, thereby forming a recess in the silicon-containing film. In (a4), a control is performed to decrease a partial pressure of the HF gas with an increase of an aspect ratio of the recess.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of a substrate processing method and a substrate processing apparatus according to the present disclosure will be described in detail with reference to the drawings. The substrate processing method and the substrate processing apparatus of the present disclosure are not limited to the embodiments.

In an etching, an etchant and an etching target film react with each other, and the portion of the etching target film that reacts with the etchant is removed by changing into a volatile reaction by-product, so that a recess is formed in the etching target film. However, when the amount of the etchant is large, the rate at which the reaction by-product is produced becomes faster than the rate at which the reaction by-product volatilizes, at the bottom of the recess, and as a result, the reaction by-product may be deposited on the bottom of the recess without volatilizing. When the reaction by-product is deposited on the bottom of the recess, the reaction by-product inhibits the reaction between the etchant and the etching target film, and thus, the etching rate decreases. When the decrease of the etching rate continues, the etching may eventually stop.

Further, when the amount of the etchant is large, the bottom of the recess may be tapered. When the bottom of the recess is tapered, the recess may be formed while being bent in the depth direction of the recess. When the recess is bent, a problem may occur such as, for example, being connected with an adjacent recess.

Meanwhile, when the amount of the etchant is small, the cross section of the bottom of the recess becomes rectangular, but the etching rate may decrease. When the etching rate decreases, the side wall of the recess is exposed to the etchant for a long time, which may cause a bowing in the side wall of the recess.

Thus, the present disclosure provides a technique capable of achieving at least one of the improvement of the etching throughput and the suppression of the shape abnormality of the recess formed by the etching.

[Structure of Plasma Processing Apparatus 100]

Figure 1:
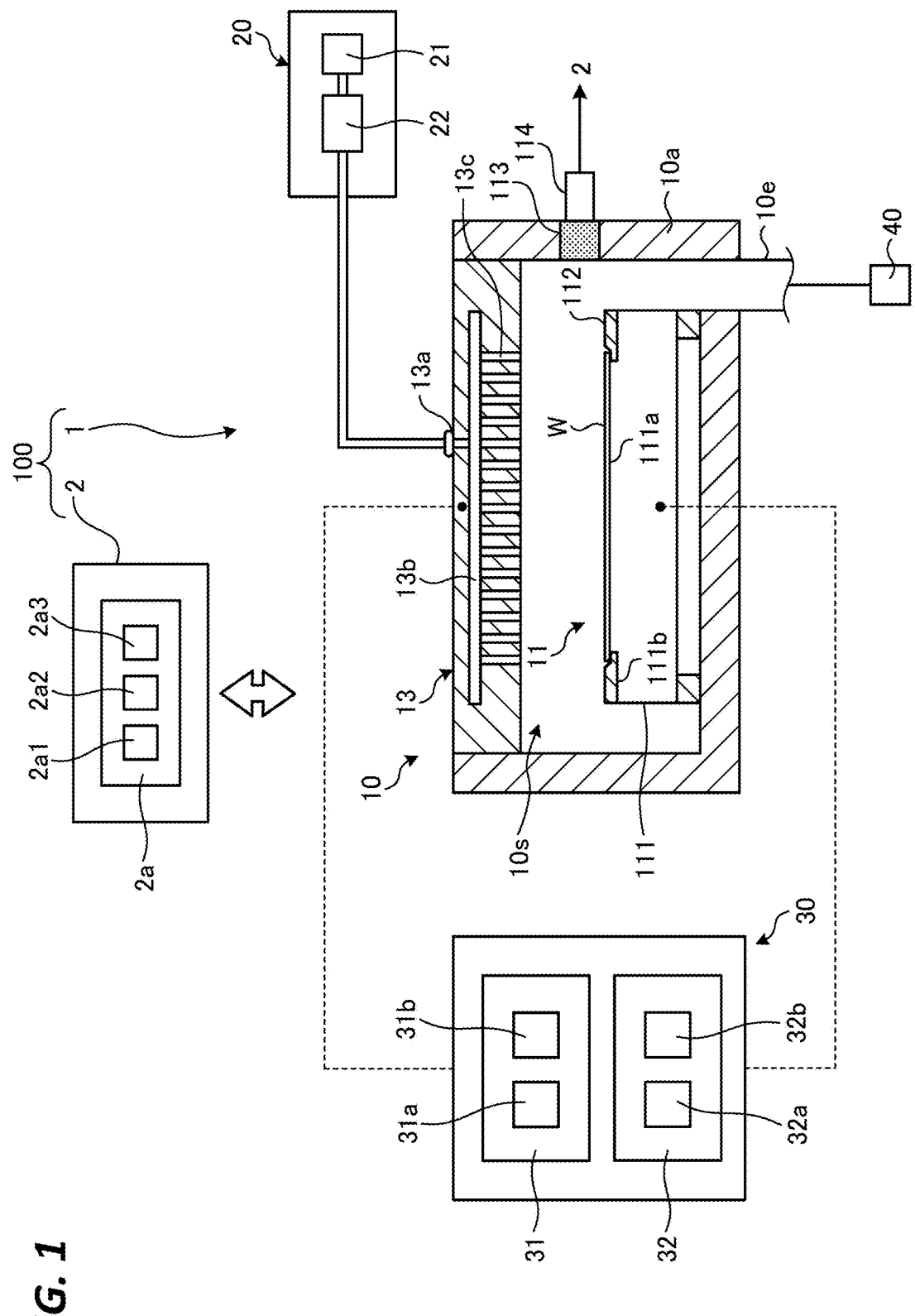
FIG. 1 is a view illustrating an example of a plasma processing apparatus according to an embodiment of the present disclosure.

An example of a configuration of a plasma processing apparatus 100 will be described herein below. FIG. 1 is a view illustrating an example of the plasma processing apparatus 100 according to an embodiment of the present disclosure. The plasma processing apparatus 100 is a capacitively coupled plasma processing apparatus, and includes an apparatus main body 1 and a control unit 2. The plasma processing apparatus 100 is an example of the substrate processing apparatus. The apparatus main body 1 includes a plasma processing chamber 10, a gas supply unit 20, a power supply 30, and an exhaust system 40. The apparatus main body 1 further includes a substrate support 11 and a gas introduction unit. The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11. In an embodiment, the shower head 13 makes up at least a portion of the ceiling of the plasma processing chamber 10.

The plasma processing chamber 10 has a plasma processing space 10s defined by the shower head 13, the side wall 10a of the plasma processing chamber 10, and the substrate support 11. The plasma processing chamber 10 includes at least one gas supply port for supplying at least one processing gas into the plasma processing space 10s, and at least one gas exhaust port for exhausting a gas from the plasma processing space 10s. The side wall 10a is grounded. The shower head 13 and the substrate support 11 are electrically insulated from the housing of the plasma processing chamber 10. Further, the plasma processing apparatus 100 may be equipped with an optical sensor 114 capable of measuring the intensity of light of each wavelength in plasma inside the plasma processing chamber 10 through a quartz window 113.

The substrate support 11 includes a main body 111 and a ring assembly 112. The main body 111 has a substrate support surface 111a which is a central region for supporting a substrate W, and a ring support surface 111b which is an annular region for supporting the ring assembly 112. The substrate W may be referred to as a wafer. The ring support surface 111b of the main body 111 surrounds the substrate support surface 111a of the main body 111 in a plan view. The substrate W is placed on the substrate support surface 111a of the main body 111, and the ring assembly 112 is disposed on the ring support surface 111b of the main body 111 to surround the substrate W placed on the substrate support surface 111a of the main body 111.

In an embodiment, the main body 111 includes an electrostatic chuck and a base. The base includes a conductive member. The conductive member of the base functions as a lower electrode. The electrostatic chuck is disposed on the base. The upper surface of the electrostatic chuck serves as the substrate support surface 111a.

The ring assembly 112 includes one or more annular members. At least one of the one or more annular members is an edge ring. Although not illustrated, the substrate support 11 may include a temperature adjustment module configured to adjust at least one of an electrostatic chuck 1110, the ring assembly 112, and the substrate W to a target temperature. The temperature adjustment module may include a heater, a heat transfer medium, a flow path, or a combination thereof. A heat transfer fluid such as brine or a gas flows through the flow path. The substrate support 11 may include a heat transfer gas supply unit configured to supply a heat transfer gas to the space between the substrate W and the substrate support surface 111a.

The shower head 13 is configured to introduce at least one processing gas from the gas supply unit 20 into the plasma processing space 10s. The shower head 13 includes at least one gas supply port 13a, at least one gas diffusion chamber 13b, and a plurality of gas introduction ports 13c. The processing gas supplied to the gas supply port 13a passes through the gas diffusion chamber 13b, and is introduced into the plasma processing space 10s from the plurality of gas introduction ports 13c. The shower head 13 further includes a conductive member. The conductive member of the shower head 13 functions as an upper electrode. The gas introduction unit may include one or a plurality of side gas injectors (SGI) attached to one or a plurality of openings formed in the side wall 10a, in addition to the shower head 13.

The gas supply unit 20 may include at least one gas source 21 and at least one flow rate control device 22. In an embodiment, the gas supply unit 20 is configured to supply at least one processing gas from the corresponding gas source 21 to the shower head 13 via the corresponding flow rate control device 22. Each flow rate control device 22 may include, for example, a mass flow controller or a pressure-controlled flow rate control device. The gas supply unit 20 may further include one or more flow rate modulation devices that modulate or pulse the flow rate of at least one processing gas.

The power supply 30 includes an RF power supply 31 coupled to the plasma processing chamber 10 via at least one impedance matching circuit. The RF power supply 31 is configured to supply at least one RF signal, such as a source RF signal or a bias RF signal, to a conductive member of the substrate support 11, the conductive member of the shower head 13, or both the conductive members. As a result, plasma is formed from at least one processing gas supplied to the plasma processing space 10s. That is, in an embodiment, the conductive member of the substrate support 11 or the conductive member of the shower head 13 may function as at least a portion of a plasma generation unit configured to generate plasma from one or more processing gases in the plasma processing chamber 10. Further, by supplying the bias RF signal to the conductive member of the substrate support 11, a bias electric potential is generated in the substrate W, so that ion components in the formed plasma may be drawn into the substrate W.

In an embodiment, the RF power supply 31 includes a first RF generation unit 31a and a second RF generation unit 31b. The first RF generation unit 31a is coupled to the conductive member of the substrate support 11, the conductive member of the shower head 13, or both the conductive members via at least one impedance matching circuit, and configured to generate a source RF signal for generating plasma. The source RF signal may be referred to as a source RF power. In an embodiment, the RF signal has a frequency signal in the range of 13 MHz to 150 MHz. In an embodiment, the first RF generation unit 31a may be configured to generate multiple source RF signals having different frequencies. The generated one or more source RF signals are supplied to the conductive member of the substrate support 11, the conductive member of the shower head 13, or both the conductive members.

The second RF generation unit 31b is coupled to the conductive member of the substrate support 11 via at least one impedance matching circuit, and configured to generate a bias RF signal. The bias RF signal may be referred to as a bias RF power. In an embodiment, the bias RF signal has a frequency lower than that of the source RF signal. In an embodiment, the bias RF signal has a frequency signal in the range of 400 kHz to 13.56 MHz. In an embodiment, the second RF generation unit 31b may be configured to generate multiple bias RF signals having different frequencies. The generated one or more bias RF signals are supplied to the conductive member of the substrate support 11. In various embodiments, at least one of the source RF signal and the bias RF signal may be pulsed.

The power supply 30 may further include a direct current (DC) power supply 32 coupled to the plasma processing chamber 10. The DC power supply 32 includes a first DC generation unit 32a and a second DC generation unit 32b. In an embodiment, the first DC generation unit 32a is connected to the conductive member of the substrate support 11, and configured to generate a first DC signal. The generated first DC signal is applied to the conductive member of the substrate support 11. In another embodiment, the first DC signal may be applied to another electrode such as an electrode 1110a of the electrostatic chuck 1110. In an embodiment, the second DC generation unit 32b is connected to the conductive member of the shower head 13, and configured to generate a second DC signal. The generated second DC signal is applied to the conductive member of the shower head 13. In various embodiments, at least one of the first and second DC signals may be pulsed. The first DC generation unit 32a and the second DC generation unit 32b may be provided in addition to the RF power supply 31, or the first DC generation unit 32a may be provided in place of the second RF generation unit 31b.

The exhaust system 40 may be connected to a gas discharge port 10e provided in, for example, the bottom of the plasma processing chamber 10. The exhaust system 40 may include a pressure regulating valve and a vacuum pump. The pressure regulating valve regulates the pressure in the plasma processing space 10s. The vacuum pump may include a turbo molecular pump, a dry pump, or a combination thereof.

The control unit 2 processes computer-executable commands for causing the apparatus main body 1 to execute various steps to be described therein. The control unit 2 may be configured to control each component of the apparatus main body 1 to execute the various steps to be described herein. In an embodiment, a portion of the control unit 2 or the entire control unit 2 may be included in the apparatus main body 1. The control unit 2 may include, for example, a computer 2a. The computer 2a may include, for example, a processing unit 2a1, a storage unit 2a2, and a communication interface 2a3. The processing unit 2a1 may be configured to perform various control operations based on programs stored in the storage unit 2a2. The processing unit 2a1 may include a central processing unit (CPU). The storage unit 2a2 may include a random access memory (RAM), a read only memory (ROM), a hard disk drive (HDD), a solid state drive (SSD), or a combination thereof. The communication interface 2a3 may communicate with the apparatus main body 1 through a communication line such as a local area network (LAN).

Figure 2:
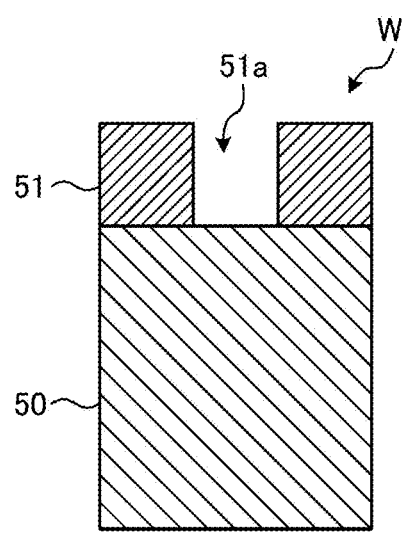
FIG. 2 is a view illustrating an example of a cross section of a substrate on which an etching is performed.

Here, an etching performed by the plasma processing apparatus 100 illustrated in FIG. 1 will be described. For example, the substrate W illustrated in FIG. 2 is used for the etching. The substrate W includes a silicon-containing film 50 which is an etching target film, and a mask 51 formed on the silicon-containing film 50. An opening 51a is formed in the mask 51.

In the present embodiment, the silicon-containing film 50 includes a silicon oxide film and a silicon nitride film. In another embodiment, the silicon-containing film 50 may be a film including a silicon oxide film and a polysilicon film, or may be a film including a silicon oxide film, a silicon nitride film, and a polysilicon film. In yet another embodiment, the silicon-containing film 50 may be a silicon oxide film, a multilayer film of a silicon oxide film and a silicon nitride film, or a multilayer film of a silicon oxide film and a polysilicon film.

In the present embodiment, the mask 51 is provided on the silicon-containing film 50. The mask 51 is formed of a material having an etching rate lower than that of the silicon-containing film 50. The mask 51 may be formed of an organic material. That is, the mask 51 may contain carbon. The mask 51 may be formed of, for example, an amorphous carbon film, a photoresist film, or a spin-on carbon film (SOC film). Further, the mask 51 may be formed of a silicon-containing film such as a silicon-containing antireflection film. Further, the mask 51 may be a metal-containing mask formed of a metal-containing material such as titanium nitride, tungsten, or tungsten carbide.

In the etching, the substrate W illustrated in FIG. 2 is carried into the plasma processing chamber 10, and placed on the substrate support 11. Then, when a voltage is supplied to the electrostatic chuck of the main body 111, the substrate W is adsorbed and held on the substrate support surface 111a. Then, the gas in the plasma processing chamber 10 is exhausted by the exhaust system 40, and a processing gas is supplied from the gas supply unit 20 into the plasma processing chamber 10 via the shower head 13. In the present embodiment, the processing gas includes HF gas. In the present embodiment, HF gas is an example of an etchant.

The processing gas may include a carbon-containing gas. The carbon-containing gas is preferably at least one gas selected from the group consisting of, for example, a fluorocarbon gas (CF-based gas) and a hydrofluorocarbon gas (CHF-based gas). As for the CF-based gas, for example, at least one gas selected from the group consisting of $Cf_4$ gas, $C_2f_2$ gas, $C_2f_4$ gas, $C_3F_8$ gas, $C_4F_6$ gas, $C_4F_8$ gas, and $C_5F_8$ gas may be used. In an example, the CF-based gas is $C_4F_6$ or $C_4F_8$. As for the CHF-based gas, at least one gas selected from the group consisting of, for example, $CHF_3$ gas, $CH_2f_2$ gas, $CH_3F$ gas, $C_2HF_5$ gas, $C_2H_2f_4$ gas, $C_2H_3F_3$ gas, $C_2H_4f_2$ gas, $C_3HF_7$ gas, $C_3H_2f_2$ gas, $C_3H_2f_4$ gas, $C_3H_2F_6$ gas, $C_3H_3F_5$ gas, $C_4H_2H_6$ gas, $C_4H_2F_8$ gas, $C_4H_5F_5$ gas, $C_5H_2F_6$ gas, $C_5H_2F_{10}$ gas, and $C_5H_3F_7$ gas may be used. In an example, the CHF-based gas is at least one gas selected from the group consisting of $C_3H_2F_4$ gas, $C_3H_2F_6$ gas, $C_4H_2F_6$ gas, and $C_4H_2F_8$ gas. When the processing gas includes the gas described above, a deposit containing carbon is formed on the surface of the mask 51, and thus, the etching of the mask 51 is suppressed. As a result, the ratio (selection ratio) of the etching rate of the silicon-containing film to the etching rate of the mask 51 may be improved.

The processing gas may include at least one gas selected from the group consisting of a phosphorus-containing gas, a sulfur-containing gas, and a boron-containing gas. As for the phosphorus-containing gas, at least one gas selected from the group consisting of, for example, $PF_3$ gas, $PF_5$ gas, $POF_3$ gas, $HPF_6$ gas, $PCl_3$ gas, $PCl_5$ gas, $POCl_3$ gas, $PBr_3$ gas, $PBr_5$ gas, $POBr_5$ gas, $PI_3$ gas, $P_4O_{10}$ gas, $P_4O_8$ gas, $P_4O_6$ gas, $PH_3$ gas, $Ca_3P_2$ gas, $H_3PO_4$ gas, and $Na_3PO_4$ gas may be used. As for the sulfur-containing gas, at least one gas selected from the group consisting of, for example, $SF_6$ gas, $SO_2$ gas, and COS gas may be used. As for the boron-containing gas, at least one gas selected from the group consisting of, for example, $BCl_3$ gas, $BF_3$ gas, $BBr_3$ gas, and $B_2H_6$ gas may be used. These gases are deposited on the side wall of a recess formed by the etching so as to form a protective film. Thus, a formation of bowing in the recess may be suppressed.

The processing gas may include a halogen-containing gas. The halogen-containing gas may not contain carbon. The halogen-containing gas may be a fluorine-containing gas or a gas containing a halogen element other than fluorine. The fluorine-containing gas may include a gas such as, for example, $NF_3$ gas, $SF_6$ gas, and $BF_3$ gas. The gas containing a halogen element other than fluorine may be at least one gas selected from the group consisting of, for example, a chlorine-containing gas, a bromine-containing gas, and an iodine-containing gas. The chlorine-containing gas is, for example, $Cl_2$ gas, HCl gas, $SiCl_2$ gas, $SiCl_4$ gas, $CCl_4$ gas, $SiH_2Cl_2$ gas, $Si_2Cl_6$ gas, $CHCl_3$ gas, $CH_2Cl_2$ gas, $CH_3Cl$ gas, $SO_2Cl_2$ gas, or $BCl_3$. The bromine-containing gas is, for example, $Br_2$ gas, HBr gas, $CBr_2f_2$ gas, $C_7F_5Br$ gas, $PBr_3$ gas, $PBr_5$ gas, $POBr_3$ gas, or $BBr_3$ gas. The iodine-containing gas is, for example, HI, $CF_3I$, $C_2F_5I$, $C_3F_7I$, $IF_5$, $IF_7$, $I_2$, or $PI_3$. A chemical species produced from the halogen-containing molecules is used to control the shape of the recess formed by a plasma etching.

The processing gas may include an oxygen-containing gas. As for the oxygen-containing gas, at least one gas selected from the group consisting of, for example, $O_2$, CO, $CO_2$, $H_2O$, and $H_7O_2$ may be used. In an example, the processing gas includes an oxygen-containing gas other than $H_2O$, i.e., at least one gas selected from the group consisting of $O_2$, CO, $CO_2$, and $H_7O_7$. The oxygen-containing gas may suppress the clogging of the opening 51a of the mask 51 during the etching.

The processing gas may include an inert gas. As for the inert gas, for example, a noble gas such as Ar, Kr, or Xe other than nitrogen gas may be used.

Then, the source RF signal is supplied from the RF power supply 31 to the conductive member of the substrate support 11 or the conductive member of the shower head 13. As a result, plasma is generated from the processing gas in the plasma processing chamber 10. Then, the bias RF signal is supplied from the RF power supply 31 to the conductive member of the substrate support 11. As a result, a bias potential is generated in the substrate W, ionic components in the plasma are drawn into the substrate W and a recess 52 is formed in the silicon-containing film 50 along the opening 51a formed in the mask 51. Instead of the bias RF signal from the RF power supply 31, the first DC signal from the DC power supply 32 may be applied to the conductive member of the substrate support 11. Further, the second DC signal from the DC power supply 32 may be applied to the conductive member of the shower head 13.

Here, when the amount of the etchant is large, that is, when the partial pressure of the etchant is high, a high etching rate may be implemented in the initial stage of the etching. However, when the partial pressure of the etchant is high, the rate at which a reaction by-product is produced becomes faster than the rate at which the reaction by-product volatilizes, at the bottom of the recess 52. As a result, the volatilization of the reaction by-product becomes difficult, so that a reaction by-product 53 is deposited on the bottom of the recess 52, as illustrated in, for example, FIG. 3A. When the reaction by-product 53 is deposited on the bottom of the recess 52, the reaction by-product 53 inhibits the reaction between the etchant and the silicon-containing film 50, which causes a decrease of the etching rate. When the decrease of the etching rate continues, the etching may eventually stop.

Figure 3A:
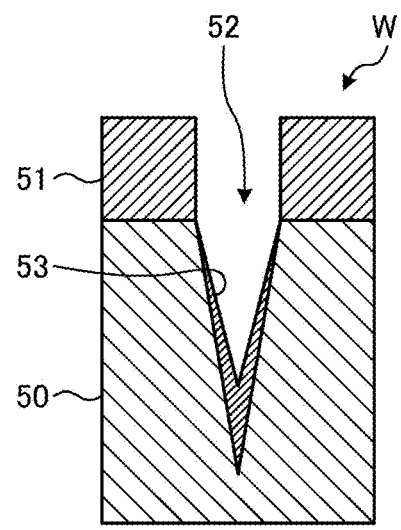
FIG. 3A is a view illustrating an example of a cross section of a recess when an amount of etchant is large.

Further, when the partial pressure of the etchant is high, the bottom of the recess 52 is tapered, as illustrated in, for example, FIG. 3A. When the bottom of the recess 52 is tapered, the recess 52 may be formed while being bent in the depth direction of the recess 52. When the recess 52 is bent, a problem may occur such as, for example, being connected with an adjacent recess 52.

Figure 3B:
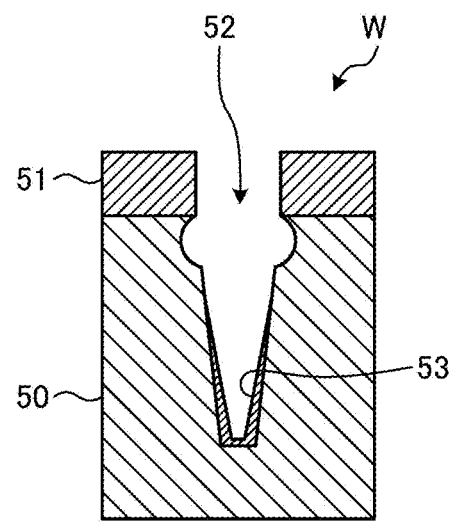
FIG. 3B is a view illustrating an example of a cross section of a recess when an amount of etchant is small.

Meanwhile, when the partial pressure of the etchant is low, the cross section of the bottom of the recess 52 becomes rectangular as illustrated in, for example, FIG. 3B, but the etching rate decreases because the amount of the etchant is small. When the etching rate decreases, the side wall of the recess 52 is exposed to the etchant for a long time. As a result, as illustrated in, for example, FIG. 3B, a lateral etching may proceed on the side wall of the recess 52, and a so-called bowing may be promoted.

[Experimental Results]

Figure 4:
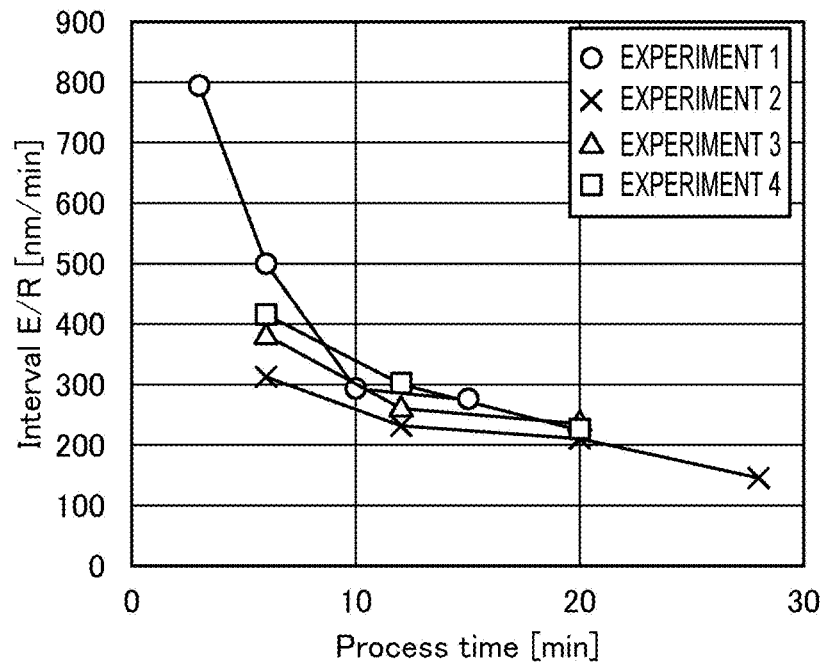
FIG. 4 is a view illustrating an example of a relationship between a processing time and an etching rate.
Figure 5:
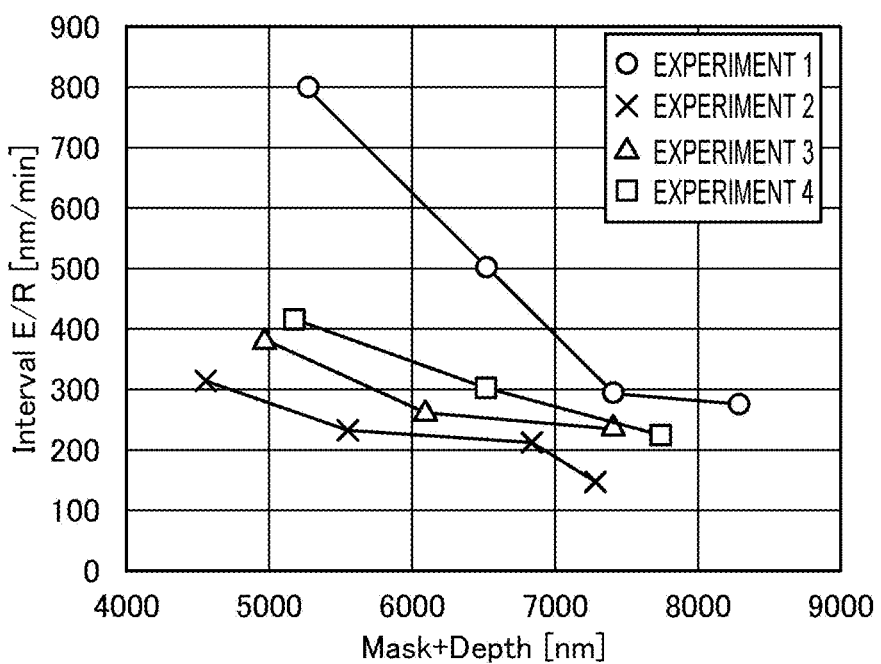
FIG. 5 is a view illustrating an example of a relationship between a depth of the recess and the etching rate.

Experiments were conducted to measure a change in etching rate under various etching conditions. FIG. 4 is a view illustrating an example of a relationship between a processing time and the etching rate. FIG. 5 is a view illustrating an example of a relationship between the depth of the recess 52 and the etching rate. Below are the main processing conditions in Experiments 1 to 4 illustrated in FIGS. 4 and 5.

[Experiment 1]
Pressure in plasma processing chamber 10: 27 mTorr
Processing gas: HF gas
Source RF signal: 40 MHz, 4,500 W
Bias RF signal: 400 kHz, 7,000 W
Temperature of substrate W: −40° C.

[Experiment 2]
Pressure in plasma processing chamber 10: 10 mTorr
Processing gas: HF gas
Source RF signal: 40 MHz, 4,500 W
Bias RF signal: 400 kHz, 7,000 W
Temperature of substrate W: −40° C.

[Experiment 3]
Pressure in plasma processing chamber 10: 27 mTorr
Processing gas: HF gas, Ar gas, $O_2$ gas
Source RF signal: 40 MHz, 4,500 W
Bias RF signal: 400 kHz, 7,000 W
Temperature of substrate W: −40° C.

[Experiment 4]
Pressure in plasma processing chamber 10: 27 mTorr
Processing gas: HF gas, $BCl_3$ gas, $C_4F_8$ gas
Source RF signal: 40 MHz, 4,500 W
Bias RF signal: 400 kHz, 7,000 W Temperature of substrate W: −40° C.

Referring to FIGS. 4 and 5, under the condition that the partial pressure of the HF gas which is the etchant is high (Experiment 1), the high etching rate is implemented in the initial stage of the etching, but the etching rate decreases sharply as the etching progresses. That is, under the condition that the partial pressure of the etchant is high, the etching rate decreases sharply with the increase of the aspect ratio of the recess 52.

Meanwhile, under the condition that the partial pressure of the HF gas is decreased by decreasing the pressure in the plasma processing chamber 10 (Experiment 2), the etching rate is lower than that in the condition of Experiment 1 at the initial stage of the etching, but the decrease of the etching rate is suppressed, as compared with the condition of Experiment 1. Further, in the condition that the partial pressure of the HF gas is decreased by adding an additive gas other than the HF gas which is the etchant to the processing gas (Experiment 3), and the condition that the partial pressure of the HF gas is decreased by adding a gas having an effect of scavenging the HF gas (Experiment 4), the decrease of the etching rate is also suppressed, as compared with the condition of Experiment 1. That is, under the condition that the partial pressure of the etchant is low (Experiments 2 to 4), the etching rate is lower than that in the condition of Experiment 1 in the initial stage of the etching, but the decrease of the etching rate with the increase of the aspect ratio of the recess 52 is suppressed. The gas having the effect of scavenging the HF gas is a gas that reacts with the element contained in the HF gas to generate a compound different from the HF gas, thereby removing or reducing the HF gas in the plasma processing chamber 10.

[Relationship between Vapor Pressure of Reaction By-Product 53 and Aspect Ratio of Recess 52]

Figure 6:
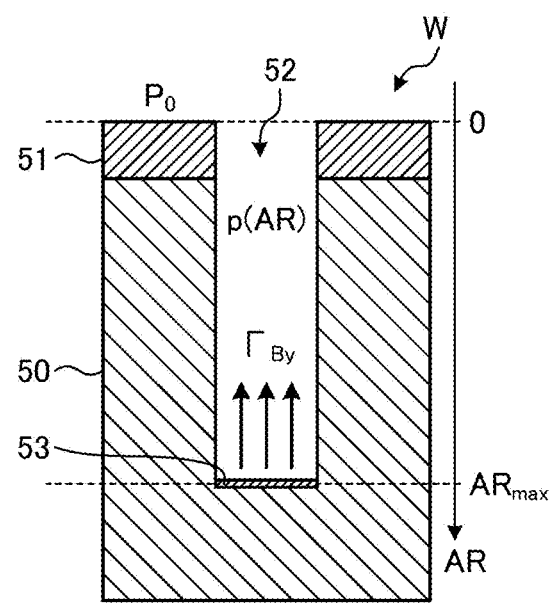
FIG. 6 is a view illustrating an example of a relationship between a vapor pressure of a reaction by-product and an aspect ratio of the recess.

FIG. 6 is a view illustrating an example of a relationship between the vapor pressure of the reaction by-product 53 and the aspect ratio of the recess 52. For example, as illustrated in FIG. 6, when the flow velocity of the reaction by-product 53 is $\Gamma_{By}$, and the position in the recess 52 in the depth direction thereof is AR, the pressure p(AR) in the recess 52 is expressed by, for example, the following equation (1).

$$p(AR) = \frac{\sqrt{3mkT}}{2}\Gamma_{By}AR + P_0 \quad (1)$$

$$(0 < AR < AR_{max})$$

In the equation (1) above, $P_0$ represents the pressure in the plasma processing chamber 10, "m" represents the mass of the molecules of the etchant, "k" represents the Boltzmann constant, and T represents the temperature of the substrate W.

As clear from the equation (1) above, the pressure p(AR) in the recess 52 is proportional to the depth AR of the recess 52. That is, the pressure $p(AR_{max})$ at the bottom of the recess 52 is proportional to the aspect ratio of the recess 52.

At the bottom of the recess 52, the generated reaction by-product 53 volatilizes, so that the etching proceeds in the depth direction of the recess 52. In order to cause the generated reaction by-product 53 to volatilize at the bottom of the recess 52, the vapor pressure $P_d$ of the reaction by-product 53 needs to be larger than the pressure $p(AR_{max})$ at the bottom of the recess 52. That is, in order to proceed with the etching in the depth direction of the recess 52, the vapor pressure Pd of the reaction by-product 53 and the pressure $p(AR_{max})$ at the bottom of the recess 52 need to satisfy the relationship of the following formula (2).

$$P_d > p(AR_{max}) = \frac{\sqrt{3mkT}}{2}\Gamma_{By}AR_{max} + P_0 \quad (2)$$

The equation (2) above may be modified into the following equation (3).

$$\Gamma_{By} < \frac{2}{\sqrt{3mkT}}\frac{(P_d - P_0)}{AR_{max}} \quad (3)$$

Since the flow velocity $\Gamma_{By}$ of the reaction by-product 53 is proportional to the etching rate, the following points may be understood from the equation (3) above.

1. As the etching rate increases, the pressure in the recess 52 increases.
2. When the pressure p(AR) in the recess 52 exceeds the vapor pressure $P_d$ of the reaction by-product 53, the reaction by-product 53 does not volatilize.
3. When the reaction by-product 53 does not volatilize, the progress of the etching stops (while the physical sputtering continues).

Then, the following conclusions may be obtained.

The upper limit of the flow velocity $\Gamma_{By}$ of the reaction by-product 53 is determined by the vapor pressure $P_d$ of the reaction by-product 53 and the aspect ratio of the recess 52.

Since the flow velocity $\Gamma_{By}$ of the reaction by-product 53 is proportional to the etching rate, the upper limit of the etching rate is also determined by the vapor pressure $P_d$ of the reaction by-product 53 and the aspect ratio of the recess 52.

As the temperature of the substrate W is low, the etching rate decreases.

As the pressure in the plasma processing chamber 10 is high, the etching rate decreases.

Accordingly, in the initial stage of the etching where the aspect ratio is low, it is preferable to increase the partial pressure of the etchant, thereby increasing the etching rate. Further, as the aspect ratio increases, the volatilization of the reaction by-product 53 becomes difficult, and the etching rate decreases. Thus, it is preferable to decrease the partial pressure of the etchant, thereby promoting the volatilization of the reaction by-product 53, and suppressing the decrease of the etching rate. As a result, the entire etching throughput for forming the recess 52 may be improved.

Further, by decreasing the partial pressure of the etchant, the cross section of the bottom of the reaction by-product 53 may be formed in a rectangular shape, as illustrated in, for example, FIG. 3B. As a result, the recess 52 may have the shape similar to a predetermined shape. Further, by decreasing the partial pressure of the etchant, the bottom of the recess 52 may be suppressed from being tapered, so that the recess 52 may be prevented from being bent in the depth direction of the recess 52.

Further, in the initial stage of the etching where the aspect ratio is low, the partial pressure of the etchant may be increased so as to increase the etching rate, thereby reducing the time until the recess 52 having a desired depth is formed. As a result, the time during which the side wall of the recess 52 is exposed to the etchant may be reduced, so that the side wall of the recess 52 may be suppressed from being expanded laterally.

As for a method of decreasing the partial pressure of the etchant, for example, four methods may be considered. The first method is a method of decreasing the pressure in the plasma processing chamber 10, thereby decreasing the partial pressure of the etchant. The second method is a method of adding a dilution gas into the plasma processing chamber 10. The dilution gas is preferably a gas that does not contribute to the etching, and may be, for example, a noble gas such as argon gas or an inert gas such as nitrogen gas. In this method as well, the partial pressure of the etchant in the plasma processing chamber 10 may be decreased. In the second method, when the dilution gas is added, the pressure in the plasma processing chamber 10 may or may not be maintained constant.

The third method is a method of supplying a reactive gas having a function of scavenging the etchant into the plasma processing chamber 10. More specifically, the third method is a method of supplying a reactive gas that reacts with the element contained in the etchant to form a compound different from the etchant, into the plasma processing chamber 10. When the etchant is HF gas, for example, a chlorine-containing gas may be used as the reactive gas. As for the chlorine-containing gas, at least one gas selected from the group consisting of, for example, $Cl_2$ gas, HCl gas, $CHCl_3$ gas, $CH_2Cl_2$ gas, $CH_3Cl$ gas, $CCl_4$ gas, $BCl_3$ gas, $SiCl_4$ gas, $SiH_2Cl_2$ gas, and $Si_2Cl_6$ gas may be used. In this method as well, the molecules of the etchant in the plasma processing chamber 10 may be reduced, and the partial pressure of the etchant in the plasma processing chamber 10 may be decreased. As described above, the processing gas may include a chlorine-containing gas as the halogen-containing gas. In this case, by adding the chlorine-containing gas as the reactive gas, that is, by increasing the flow rate ratio of the chlorine-containing gas, the partial pressure of the etchant in the plasma processing chamber 10 may be decreased.

The fourth method is a method of decreasing the flow rate of the etchant supplied into the plasma processing chamber 10. When the etchant is HF gas, the flow rate of the HF gas supplied into the plasma processing chamber 10 may be decreased, thereby decreasing the partial pressure of the HF gas in the plasma processing chamber 10.

[Substrate Processing Method]

Figure 7:
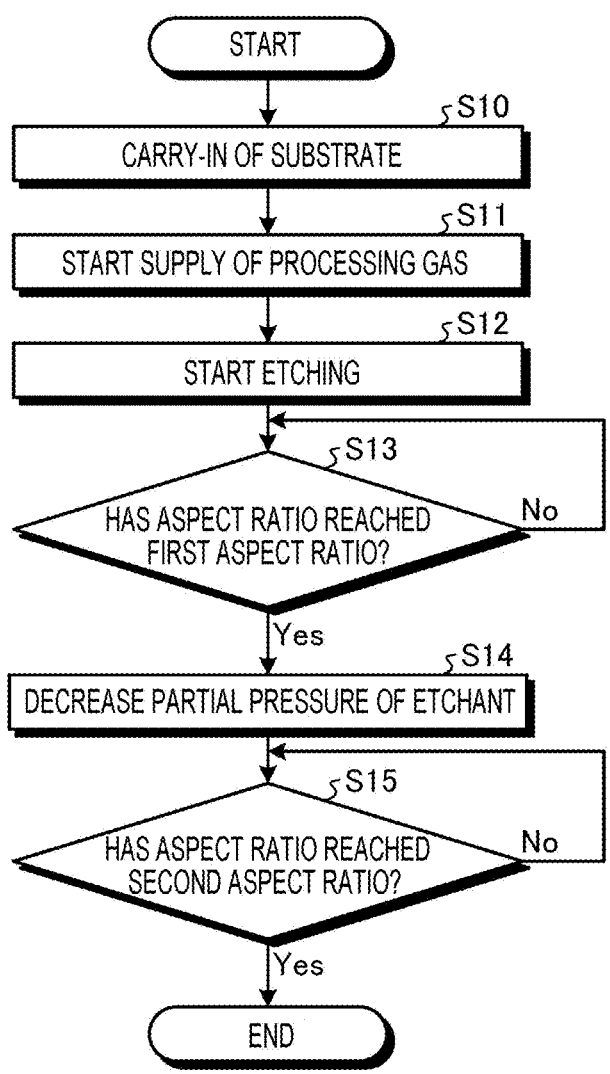
FIG. 7 is a flowchart illustrating an example of a substrate processing method according to an embodiment of the present disclosure.

FIG. 7 is a flowchart illustrating an example of the substrate processing method according to the embodiment of the present disclosure. Each process illustrated in FIG. 7 is implemented when the control unit 2 controls each unit of the apparatus main body 1.

First, the control unit 2 controls a transfer device (not illustrated) to carry, for example, the substrate W illustrated in FIG. 2 into the plasma processing chamber 10 (S10). Then, the substrate W is placed on the substrate support 11, and when a voltage is supplied to the electrostatic chuck of the main body 111, the substrate W is adsorbed and held on the substrate support surface 111a. Step S10 is an example of steps (a1), (b1), (e1), and (d1).

Next, the gas in the plasma processing chamber 10 is exhausted by the exhaust system 40, and the supply of the processing gas including HF gas into the plasma processing chamber 10 is started (S11). Then, the pressure in the plasma processing chamber 10 is adjusted to a predetermined pressure P1. The pressure P1 may be, for example, 5 mTorr (0.65 Pa) or more and 100 mTorr (13.3 Pa) or less. Step S11 is an example of steps (a2), (b2), (c2), and (d2).

Next, the etching is started (S12). Step S12 is an example of steps (a3), (b3), (c3), and (d3). In step S12, the source RF signal is supplied from the RF power supply 31 to the conductive member of the substrate support 11 or the conductive member of the shower head 13, so that plasma is generated from the processing gas in the plasma processing chamber 10. The source RF signal may be set to, for example, 2 kW or more and 10 kW or less. Then, the bias RF signal is supplied from the RF power supply 31 to the conductive member of the substrate support 11. As a result, a bias potential is generated in the substrate W, and the ionic components in the plasma are drawn into the substrate W, so that the etching on the substrate W is started. The bias RF signal may be set to, for example, 2 kW or more. The power level of the bias RF signal may be set to 10 kW or more.

Instead of the bias RF signal, an electrical bias other than the bias RF signal may be supplied to the conductive member of the substrate support 11. In an example, the electrical bias is a DC voltage. The electrical bias may be supplied to the conductive member of the substrate support 11 such that a negative potential is generated in the substrate W. The electrical bias may be continuously or periodically supplied. When the electrical bias is periodically supplied, the cycle of the electrical bias includes two periods. In one of the two periods, the electrical bias is a negative voltage. The level of voltage (i.e., absolute value) in one of the two periods is higher than the level of voltage (i.e., absolute value) in the other of the two periods. The voltage in the other of the two periods may be either a negative or positive voltage. The level of the negative voltage in the other of the two periods may be higher than zero or may be zero.

The electrical bias may be a pulse wave or a continuous wave. When the electrical bias is a pulse wave, the electrical bias may be a rectangular wave pulse, a triangular wave pulse, an impulse, or any other voltage waveform pulses.

In step S12, the temperature of the substrate support 11 may be controlled to a low temperature. The temperature of the substrate support 11 may be, for example, 20° C. or lower, 0° C. or lower, −10° C. or lower, −20° C. or lower, −30° C. or lower. −40° C. or lower, or −70° C. or lower. The temperature of the substrate support 11 may be adjusted by a heat exchange medium supplied from a chiller unit (not illustrated).

Next, the control unit 2 determines whether the aspect ratio of the recess 52 has reached a predetermined first aspect ratio AR1 (S13). For example, the control unit 2 determines whether the etching duration has reached the etching duration until the aspect ratio of the recess 52 reaches the first aspect ratio AR1, so as to determine whether the aspect ratio of the recess 52 has reached the first aspect ratio AR1. The etching duration until the aspect ratio of the recess 52 reaches the first aspect ratio AR1 is measured in advance by experiments. When it is determined that the aspect ratio of the recess 52 has not reached the first aspect ratio AR1 (S13: No), the process of step S13 is performed again.

Meanwhile, when it is determined that the aspect ratio of the recess 52 has reached the first aspect ratio AR1 (S13: Yes), the control unit 2 controls each unit of the apparatus main body 1 to decrease the partial pressure of the etchant from the pressure P1 to the pressure P2 lower than the pressure P1 (S14). Step S14 is an example of steps (a4), (b4), (c4), and (d4). For example, the control unit 2 controls the gas supply unit 20 and the exhaust system 40 to decrease the pressure in the plasma processing chamber 10, thereby decreasing the partial pressure of the etchant. The method of decreasing the partial pressure of the etchant may be a method of adding a gas other than the etchant into the plasma processing chamber 10. Further, the method of decreasing the partial pressure of the etchant may be a method of supplying a reactive gas that reacts with the element contained in the etchant to scavenge the etchant, into the plasma processing chamber 10.

Figure 8:
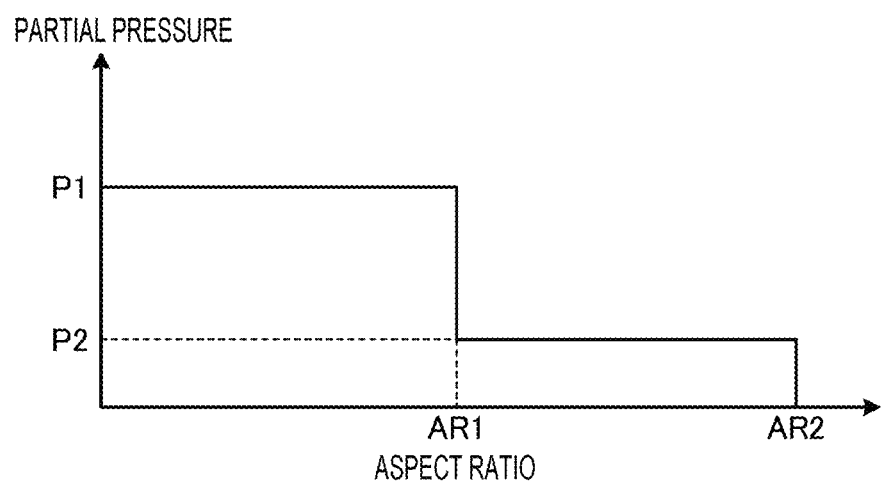
FIG. 8 is a view illustrating an example of a change in partial pressure of an etchant.

As a result, the partial pressure of the etchant is maintained at the pressure PI until the aspect ratio of the recess 52 reaches the first aspect ratio AR1, as illustrated in, for example, FIG. 8. Then, after the aspect ratio of the recess 52 reaches the first aspect ratio AR1, the partial pressure of the etchant is changed to the pressure P2 lower than the pressure P1.

Next, the control unit 2 determines whether the aspect ratio of the recess 52 has reached a predetermined second aspect ratio AR2 (S15). When it is determined that the aspect ratio of the recess 52 has not reached the second aspect ratio AR2 (S15: No), the process of step S15 is performed again. Meanwhile, when it is determined that the aspect ratio of the recess 52 has reached the second aspect ratio AR2 (S15: Yes), the substrate processing method illustrated in FIG. 7 ends.

The embodiment has been described. As described above, the substrate processing method of the present embodiment includes steps (a1), (a2), (a3), and (a4). In step (a1), the substrate W including the silicon-containing film 50 is provided in the plasma processing chamber 10. In step (a2), the processing gas including HF gas is supplied into the plasma processing chamber 10. In step (a3), the silicon-containing film 50 is etched by plasma generated from the processing gas so that the recess 52 is formed in the silicon-containing film 50. In step (a4), a control is performed to decrease the partial pressure of the HF gas with an increase of the aspect ratio of the recess 52. As a result, the throughput of the etching may be improved, and further, the shape abnormality of the recess 52 foamed by the etching may be suppressed.

In the embodiment described above, in step (a4), the partial pressure of the HF gas is decreased by decreasing the pressure in the plasma processing chamber 10. As a result, the partial pressure of the etchant may be decreased.

In the embodiment described above, in step (a4), the partial pressure of the HF gas may be decreased by adding a dilution gas into the plasma processing chamber 10. At this time, the partial pressure of the HF gas may be decreased while maintaining the pressure in the plasma processing chamber 10. In this case as well, the partial pressure of the etchant may be decreased.

In the embodiment described above, in step (a4), the partial pressure of the HF gas in the plasma processing chamber 10 may be decreased by supplying a reactive gas that reacts with the element contained in the molecules of the HF gas to scavenge the HF gas, into the plasma processing chamber 10. In this case as well, the partial pressure of the etchant may be decreased.

In the embodiment described above, in step (a4), the partial pressure of the HF gas in the plasma processing chamber 10 may be decreased by decreasing the flow rate of the HF gas supplied into the plasma processing chamber 10. In this case as well, the partial pressure of the etchant may be decreased.

In the embodiment described above, the reactive gas is, for example, a chlorine-containing gas. The chlorine-containing gas is, for example, at least one gas selected from the group consisting of $Cl_2$ gas, HCl gas, $CHCl_3$ gas, $CH_2Cl_2$ gas, $CH_3Cl$ gas, $CCl_4$ gas, $BCl_3$ gas, $SiCl_4$ gas, $SiH_2Cl_2$ gas, and $Si_2Cl_6$ gas. By adding this gas into the plasma processing chamber 10, the partial pressure of the HF gas in the plasma processing chamber 10 may be decreased.

In the embodiment described above, the processing gas may include a carbon-containing gas. The carbon-containing gas is preferably at least one gas selected from the group consisting of, for example, a CF-based gas and a CHF-based gas. As for the CF-based gas, at least one gas selected from the group consisting of, for example, $CF_4$ gas, $C_2f_2$ gas, $C_2f_4$ gas, $C_3F_8$ gas, $C_4F_6$ gas, $C_4F_8$ gas, and $C_5F_8$ gas may be used. As for the CHF-based gas, at least one gas selected from the group consisting of, for example, $CHF_3$ gas, $CH_2f_2$ gas, $CH_3F$ gas, $C_2HF_5$ gas, $C_2H_2F_4$ gas, $C_2H_3F_3$ gas, $C_2H_4F_2$ gas, $C_3HF_7$ gas, $C_3H_2F_2$ gas, $C_3H_2F_6$ gas, $C_3H_2F_4$ gas, $C_3H_3F_5$ gas, $C_4H_5F_5$ gas, $C_4H_2F_6$ gas, $C_4H_2F_8$ gas, $C_5H_2F_6$ gas, $C_5H_2F_{10}$ gas, and $C_5H_3F_7$ gas may be used. When this gas is included in the processing gas, a deposit containing carbon is formed on the surface of the mask 51, so that the etching of the mask 51 is suppressed. Thus, the ratio of the etching rate of the silicon-containing film (selection ratio) to the etching rate of the mask 51 may be improved.

In the embodiment described above, the processing gas may include at least one gas selected from the group consisting of a phosphorus-containing gas, a sulfur-containing gas, and a boron-containing gas. As for the phosphorus-containing gas, at least one gas selected from the group consisting of, for example, $PF_3$ gas, $PF_5$ gas, $POF_3$ gas, $HPF_6$ gas, $PCl_3$ gas, $PCl_5$ gas, $POCl_3$ gas, $PBr_3$ gas, $PBr_5$ gas, $POBr_3$ gas, $PI_3$ gas, $P_4O_{10}$ gas, $P_4O_8$ gas, $P_4O_6$ gas, $PH_3$ gas, $Ca_3P_2$ gas, $H_3PO_4$ gas, and $Na_3PO_4$ gas may be used. As for the sulfur-containing gas, at least one gas selected from the group consisting of, for example, $SF_6$ gas, $SO_2$ gas, and COS gas may be used. As for the boron-containing gas, at least one gas selected from the group consisting of, for example, $BCl_3$ gas, $BF_3$ gas, $BBr_3$ gas, and $B_2H_6$ gas may be used. These gases are deposited on the side wall of the recess 52 formed by the etching so as to form a protective film. Thus, the formation of bowing in the recess 52 may be suppressed.

In the embodiment described above, the silicon-containing film includes at least one film selected from the group consisting of a silicon oxide film, a silicon nitride film, and a polysilicon film.

In the embodiment described above, the silicon-containing film is a silicon oxide film, a multilayer film of a silicon oxide film and a silicon nitride film, or a multilayer film of a silicon oxide film and a polysilicon film.

In the embodiment described above, the plasma processing apparatus includes the plasma processing chamber 10, the substrate support 11, the plasma generation unit (the conductive member of the substrate support 11 or the conductive member of the shower head 13), and the control unit 2. The plasma processing chamber 10 includes the gas supply port 13a and the gas discharge port 10e. The substrate support 11 is provided in the plasma processing chamber 10. The substrate W is placed on the substrate support 11. The plasma generation unit generates plasma from the processing gas supplied into the plasma processing chamber 10. The control unit 2 is configured to perform the process including steps (d1), (d2), (d3), and (d4). In step (d1), the control unit 2 places the substrate W having the silicon-containing film 50 on the substrate support 11. In step (d2), the processing gas including HF gas is supplied into the plasma processing chamber 10 from the gas supply port 13a. In step (d3), the control unit 2 generates plasma from the processing gas, and etches the silicon-containing film 50 with the generated plasma, thereby forming the recess 52 in the silicon-containing film 50. In step (d4), the control unit 2 performs a control to decrease the partial pressure of the HF gas with an increase of the aspect ratio of the recess 52. As a result, at least one of the improvement of the etching throughput and the suppression of the shape abnormality of the recess 52 formed by the etching may be achieved.

[Miscellaneous]

The present disclosure is not limited to the embodiment described above, and many modifications may be made thereto within the scope of the gist of the present disclosure.

For example, in the embodiment described above, the partial pressure of the etchant is changed once during the formation of the recess 52. However, the present disclosure is not limited thereto. As illustrated in, for example, FIG. 9, the partial pressure of the etchant may be changed multiple times during the formation of the recess 52.

Figure 9:
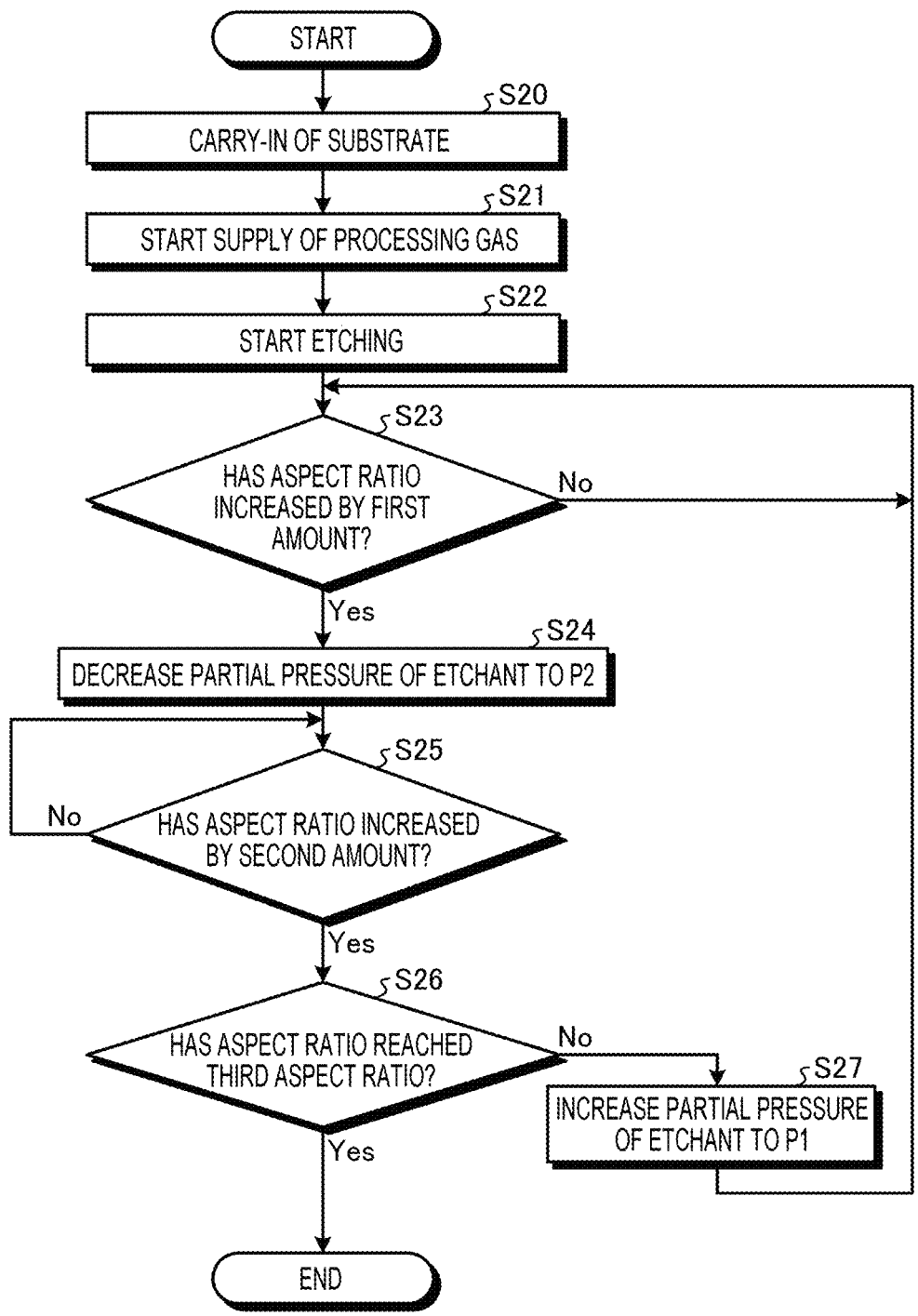
FIG. 9 is a flowchart illustrating another example of the substrate processing method.

FIG. 9 is a flowchart illustrating another example of the substrate processing method. Each process illustrated in FIG. 9 is implemented when the control unit 2 controls each unit of the apparatus main body 1.

First, the control unit 2 controls a transfer device (not illustrated) to carry, for example, the substrate W illustrated in FIG. 2 into the plasma processing chamber 10 (S20). Then, the gas in the plasma processing chamber 10 is exhausted by the exhaust system 40, and the supply of the processing gas including HF gas into the plasma processing chamber 10 is started (S21). Then, the etching is started (S22). The processes of steps S20 to S22 are the same as the processes of steps S10 to S12 illustrated in FIG. 7.

Next, the control unit 2 determines whether the aspect ratio of the recess 52 has increased by a predetermined first amount (S23). For example, the control unit 2 determines whether the etching duration has reached the etching duration until the aspect ratio of the recess 52 increases by the first amount, so as to determine whether the aspect ratio of the recess 52 has increased by the first amount. The etching duration until the aspect ratio of the recess 52 increases by the first amount is measured in advance by experiments. When it is determined that the aspect ratio of the recess 52 has not increased by the first amount (S23: No), the process of step S23 is performed again.

Meanwhile, when it is determined that the aspect ratio of the recess 52 has increased by the first amount (S23: Yes), the control unit 2 controls each unit of the apparatus main body 1 to decrease the partial pressure of the etchant from the pressure P1 to the pressure P2 lower than the pressure P1 (S24). The pressure P1 is an example of a first pressure, and the pressure P2 is an example of a second pressure. The process of step S24 is the same as the process of step S14 illustrated in FIG. 7.

Next, the control unit 2 determines whether the aspect ratio of the recess 52 has increased by a predetermined second amount (S25). For example, the control unit 2 determines whether the etching duration has reached the etching duration until the aspect ratio of the recess 52 increases by the second amount, so as to determine whether the aspect ratio of the recess 52 has increased by the second amount. The etching duration until the aspect ratio of the recess 52 increases by the second amount is measured in advance by experiments. When it is determined that the aspect ratio of the recess 52 has not increased by the second amount (S25: No), the process of step S25 is performed again.

Meanwhile, when it is determined that the aspect ratio of the recess 52 has increased by the second amount (S25: Yes), the control unit 2 determines whether the aspect ratio of the recess 52 has reached a predetermined third aspect ratio (S26). When it is determined that the aspect ratio of the recess 52 has not reached the third aspect ratio (S26: No), the control unit 2 controls each unit of the apparatus main body 1 to increase the partial pressure of the etchant from the pressure P2 to the pressure P1 (S27). Then, the process of step S23 is performed again. Meanwhile, when it is determined that the aspect ratio of the recess 52 has reached the third aspect ratio (S26: Yes), the substrate processing method illustrated in FIG. 9 ends.

Figure 10:
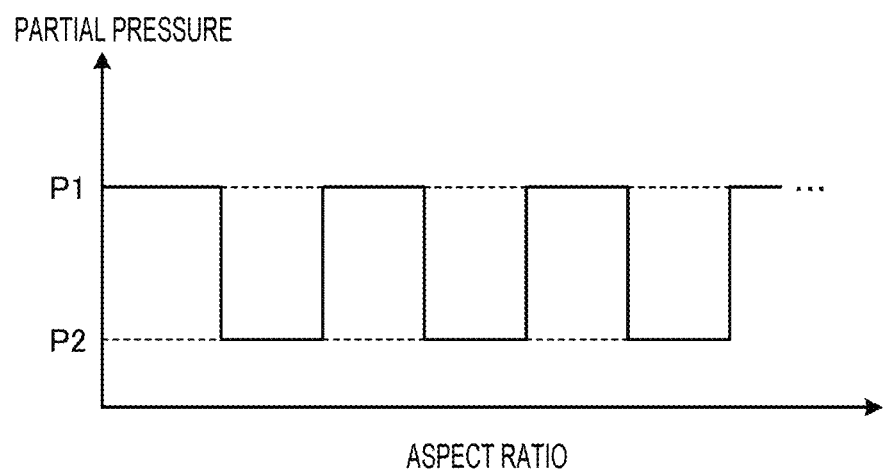
FIG. 10 is a view illustrating another example of the change in partial pressure of the etchant.

Thus, while the etching of the recess 52 is continued, the partial pressure of the etchant is controlled such that the pressures P1 and P2 are alternately repeated as illustrated in, for example, FIG. 10. Here, when the partial pressure of the etchant is controlled to the pressure P1, the etching is performed at a high etching rate, and the recess 52 is formed. When the partial pressure of the etchant is controlled to the pressure P2 lower than the pressure P1, the cross section of the bottom of the recess 52 is formed in a rectangular shape. In this way, the partial pressure of the etchant is controlled such that the pressures P1 and P2 are alternately repeated, so that the rapid progress of the etching and the process of adjusting the shape of the bottom of the recess 52 are alternately performed. As a result, both the improvement of the etching throughput and the suppression of the shape abnormality of the recess 52 formed by the etching may be achieved.

Figure 11:
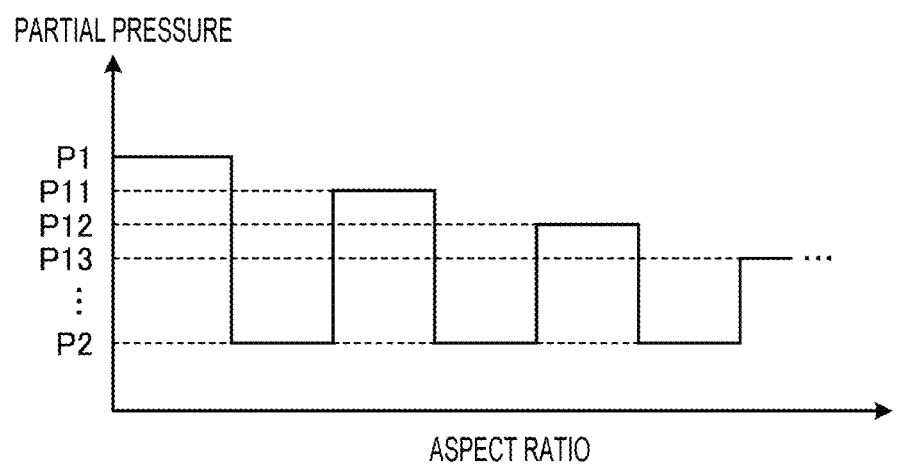
FIG. 11 is a view illustrating yet another example of the change in partial pressure of the etchant.

In the process of controlling the partial pressure of the etchant such that the pressures P1 and P2 are alternately repeated, the relatively higher pressure P1 may be controlled to gradually decrease with the increase of the aspect ratio of the recess 52, as illustrated in, for example, FIG. 11. In the example of FIG. 11, the pressure P1 is controlled to gradually decrease in an order of, for example, pressures P11, P12, P13 . . . , with the increase of the aspect ratio of the recess 52. As a result, it is possible to prevent the case where the volatilization of the reaction by-product 53 becomes difficult as the aspect ratio increases. Further, the relatively lower pressure P2 may be constant, regardless of the increase of the aspect ratio of the recess 52.

The partial pressure of the etchant may be controlled based on an output value of the flow rate control device 22. Further, the partial pressure of the etchant may be controlled based on an estimated value which is obtained by monitoring the light emission state of plasma. The light emission state of plasma may be measured by, for example, the optical sensor 114 such as an optical emission spectroscopy (OES) sensor attached to the plasma processing chamber 10. As a result, since the partial pressure of the etchant including the etchant dissociated or generated in the plasma may be measured, the partial pressure of the etchant may be precisely controlled.

In the embodiment described above, the HF gas is used as the etchant. However, the present disclosure is not limited thereto. In another embodiment, a gas capable of producing an HF species in the plasma processing chamber 10 during the plasma processing may be used. The HF species includes at least one of hydrogen fluoride gas, radicals, and ions. In an example, the gas capable of producing the HF species may be a hydrofluorocarbon gas. Further, the gas capable of producing the HF species may be a mixed gas including a hydrogen source and a fluorine source. The hydrogen source may be, for example, $H_2$, $NH_3$, $H_2O$, $H_2O_2$, or a hydrocarbon. The fluorine source may be, for example, $NF_3$, $SF_6$, $WF_6$, $XeF_2$, fluorocarbon, or hydrofluorocarbon. When the gas capable of producing the HF species is used, a control is performed to decrease the partial pressure of the HF species with an increase of the aspect ratio of the recess 52. The partial pressure of the HF species may be calculated based on, for example, the light emission state of plasma measured by the OES described above. As a result, both the improvement of the etching throughput and the suppression of the shape abnormality of the recess 52 formed by the etching may be achieved.

As another embodiment, an active species included in the plasma generated from the processing gas may be used as the etchant. This processing gas may be a processing gas including an etchant which is at least one gas selected from the group consisting of a gas containing fluorine, a gas containing carbon and fluorine, and a gas containing carbon, hydrogen, and fluorine. When the gas containing fluorine is used, F radicals included in plasma generated from the gas containing fluorine serves as the etchant. When the gas containing carbon and fluorine is used, CF radicals included in plasma generated from the gas containing carbon and fluorine serve as the etchant. When the gas containing carbon, hydrogen, and fluorine is used, CF radicals included in plasma generated from the gas containing carbon, hydrogen, and fluorine serve as the etchant. Then, a control is performed to decrease the partial pressure of the etchant with an increase of the aspect ratio. As a result, both the improvement of the etching throughput and the suppression of the shape abnormality of the recess 52 formed by the etching may be achieved. When the partial pressure of the etchant is decreased by adding a reactive gas, it may be conceived to add, for example, a hydrogen-containing gas or an oxygen-containing gas as the reactive gas.

In the embodiment described above, the partial pressure of the HF gas (etchant) is controlled to decrease with an increase of the aspect ratio of the recess 52 formed by the etching. However, the present disclosure is not limited thereto. In another embodiment, the partial pressure of the etchant may be adjusted to an arbitrary value according to the increase of the aspect ratio of the recess 52. That is, the partial pressure of the etchant may be controlled to decrease or increase according to the increase of the aspect ratio of the recess 52. The effects obtained in a case where the partial pressure of the HF gas (etchant) is controlled to decrease with an increase of the aspect ratio of the recess 52 are the same as described above. Meanwhile, when the partial pressure of the HF gas (etchant) is controlled to increase with an increase of the aspect ratio of the recess 52, the etching may be progressed after the shape of the recess is adjusted. Thus, the etching rate may be improved while maintaining the shape of the recess.

In the embodiment described above, the plasma processing apparatus 100 that performs a processing using capacitively coupled plasma (CCP) as an example of a plasma source has been described. However, the plasma source is not limited thereto. Examples of plasma sources other than the capacitively coupled plasma may include inductively coupled plasma (ICP), microwave excited surface wave plasma (SWP), electron cyclotron resonance plasma (ECP), and helicon wave excited plasma (HWP).

According to various aspects and embodiments of the present disclosure, it is possible to achieve at least one of the improvement of the etching throughput and the suppression of the shape abnormality of a recess formed by an etching.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
   (a1) providing a substrate including a silicon-containing film in a chamber;
   (a2) supplying a processing gas including HF gas into the chamber;
   (a3) etching the silicon-containing film with plasma generated from the processing gas, thereby forming a recess in the silicon-containing film; and
   (a4) controlling a partial pressure of the HF gas such that the partial pressure of the HF gas is decreased with an increase of an aspect ratio of the recess.

2. The substrate processing method according to claim 1, wherein in (a4), the partial pressure of the HF gas is decreased by decreasing a pressure in the chamber.

3. The substrate processing method according to claim 1, wherein in (a4), the partial pressure of the HF gas is decreased by adding a dilution gas in the chamber.

4. The substrate processing method according to claim 1, wherein in (a4), the partial pressure of the HF gas in the chamber is decreased by supplying a reactive gas that reacts with an element contained in molecules of the HF gas to scavenge the molecules of the HF gas, into the chamber.

5. The substrate processing method according to claim 4, wherein the reactive gas is a chlorine-containing gas.

6. The substrate processing method according to claim 5, wherein the chlorine-containing gas is at least one gas selected from the group consisting of $Cl_2$ gas, HCl gas, $CHCl_3$ gas, $CH_2Cl_2$ gas, $CH_3Cl$ gas, $CCl_4$ gas, $BCl_3$ gas, SiCl gas, $SiH_2Cl$ gas, and $Si_2Cl_6$ gas.

7. The substrate processing method according to claim 1, wherein in (a4), the partial pressure of the HF gas in the chamber is decreased by decreasing a flow rate of the HF gas supplied into the chamber.

8. The substrate processing method according to claim 1, wherein in (a3), the partial pressure of the HF gas is controlled to a first partial pressure, in (a4), the partial pressure of the HF gas is controlled to a second partial pressure lower than the first partial pressure, and
(a3) and (a4) are alternately repeated.

9. The substrate processing method according to claim 8, wherein in (a3) repeated alternately with (a4), the first partial pressure is controlled to gradually decrease with the increase of the aspect ratio of the recess.

10. The substrate processing method according to claim 1, wherein the processing gas includes a carbon-containing gas.

11. The substrate processing method according to claim 10, wherein the carbon-containing gas is at least one gas selected from the group consisting of fluorocarbon gas and hydrofluorocarbon gas.

12. The substrate processing method according to claim 11, wherein the fluorocarbon gas is at least one gas selected from the group consisting of $CF_4$ gas, $C_2F_2$ gas, $C_2F_4$ gas, $C_3F_8$ gas, $C_4F_6$ gas, $C_4F_8$ gas, and $C_5F_8$ gas.

13. The substrate processing method according to claim 11, the hydrofluorocarbon gas is at least one gas selected from the group consisting of $CHF_3$ gas, $CH_2F_2$ gas, $CH_3F$ gas, $C_2HF_5$ gas, $C_2H_2F_4$ gas, $C_2H_3F_3$ gas, $C_2H_4F_2$ gas, $C_3HF_7$ gas, $C_3H_2F_2$ gas, $C_3H_2F_6$ gas, $C_3H_2F_4$ gas, $C_3H_3F_5$ gas, $C_4H_5F_5$ gas, $C_4H_2F_6$ gas, $C_4H_2F_6$ gas, $C_5H_2F_6$ gas, $C_5H_2F_{10}$ gas, and $C_5H_3F_7$ gas.

14. The substrate processing method according to claim 1, wherein the processing gas includes at least one gas selected from the group consisting of a phosphorus-containing gas, a sulfur-containing gas, and a boron-containing gas.

15. The substrate processing method according to claim 14, wherein the phosphorus-containing gas is at least one gas selected from the group consisting of $PF_3$ gas, $PF_5$ gas, $POF_3$ gas, $HPF_6$ gas, $PCl_3$ gas, $PCl_5$ gas, $POCl_3$ gas, $PBr_3$ gas, $PBr_5$ gas, $POBr_3$ gas, $PI_3$ gas, $P_4O_{10}$ gas, $P_4O_8$ gas, $P_4O_6$ gas, $PH_3$ gas, $Ca_3P_2$ gas, $H_3PO_4$ gas, and $Na_3PO_4$ gas.

16. The substrate processing method according to claim 14, wherein the sulfur-containing gas is at least one gas selected from the group consisting of $SF_6$ gas, $SO_2$ gas, and COS gas.

17. The substrate processing method according to claim 14, wherein the boron-containing gas is at least one gas selected from the group consisting of $BCl_3$ gas, $BF_3$ gas, $BBr_3$ gas, and $B_2H_6$ gas.

18. The substrate processing method according to claim 1, wherein the silicon-containing film includes at least one film selected from the group consisting of a silicon oxide film, a silicon nitride film, and a polysilicon film.

19. The substrate processing method according claim 1, wherein the silicon-containing film is a silicon oxide film, a multilayer film of a silicon oxide film and a silicon nitride film, or a multilayer film of a silicon oxide film and a polysilicon film.

20. The substrate processing method according to claim 1, wherein in (a4), the partial pressure of the HF gas is estimated by monitoring a light emission state of the plasma, and the estimated partial pressure of the HF gas is controlled to decrease.

21. A substrate processing method comprising:
   (b1) providing a substrate including a silicon-containing film in a chamber;
   (b2) supplying a processing gas including a gas capable of producing an HF species into the chamber;
   (b3) etching the silicon-containing film with plasma generated from the processing gas, thereby forming a recess in the silicon-containing film; and (b4) controlling a partial pressure of the HF species such that the partial pressure of the HF is decreased with an increase of an aspect ratio of the recess.

22. A substrate processing apparatus comprising:

a chamber including a gas supply port and a gas discharge port;

a substrate support provided in the chamber;

a plasma generator configured to generate plasma from a processing gas supplied into the chamber;

and a controller, wherein the controller is configured to execute a process including:

(d1) placing a substrate including a silicon-containing film on the substrate support, (d2) supplying a processing gas including HF gas into the chamber, (d3) generating plasma from the processing gas, and etching the silicon-containing film with the generated plasma, thereby forming a recess in the silicon-containing film, and (d4) controlling a partial pressure of the HF gas such that the partial pressure of the HF is decreased with an increase of an aspect ratio of the recess.

* * * * *